（12）United States Patent
Feng et al.

(10) Patent No.: US 9,653,290 B2
(45) Date of Patent: May 16, 2017

(54) METHOD FOR MANUFACTURING NANOWIRE TRANSISTOR DEVICE

(71) Applicant: UNITED MICROELECTRONICS CORP., Hsin-Chu (TW)

(72) Inventors: Li-Wei Feng, Kaohsiung (TW);
Shih-Hung Tsai, Tainan (TW);
Shih-Fang Hong, Tainan (TW);
Chao-Hung Lin, Changhua County (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/378,015

(22) Filed: Dec. 13, 2016

(65) Prior Publication Data
US 2017/0092737 A1    Mar. 30, 2017

Related U.S. Application Data

(62) Division of application No. 14/634,904, filed on Mar. 2, 2015, now Pat. No. 9,559,164.

(30) Foreign Application Priority Data

Jan. 26, 2015  (CN) .......................... 2015 1 0037261

(51) Int. Cl.
*H01L 21/20* (2006.01)
*H01L 27/12* (2006.01)
*H01L 21/02* (2006.01)
*H01L 29/06* (2006.01)

(52) U.S. Cl.
CPC .... *H01L 21/02603* (2013.01); *H01L 29/0673* (2013.01); *H01L 29/0669* (2013.01)

(58) Field of Classification Search
CPC ................. H01L 29/0673; H01L 21/02603
USPC ........................................ 438/479; 257/347
See application file for complete search history.

(56) References Cited

U.S. PATENT DOCUMENTS

| | | | |
|---|---|---|---|
| 7,067,867 B2 | 6/2006 | Duan | |
| 8,420,455 B2 | 4/2013 | Bangsaruntip et al. | |
| 8,642,996 B2 | 2/2014 | Cohen | |
| 9,029,834 B2 * | 5/2015 | Bangsaruntip | B82Y 10/00 257/24 |
| 9,559,164 B2 * | 1/2017 | Feng | H01L 21/02603 257/347 |

* cited by examiner

*Primary Examiner* — Calvin Lee
(74) *Attorney, Agent, or Firm* — Winston Hsu; Scott Margo

(57) ABSTRACT

A method for manufacturing a nanowire transistor device includes the following steps: A substrate is provided, and the substrate includes a plurality of nanowires suspended thereon. Each of the nanowires includes a first semiconductor core. Next, a first selective epitaxial growth process is performed to form second semiconductor cores respectively surrounding the first semiconductor cores. The second semiconductor cores are spaced apart from the substrate. After forming the second semiconductor core, a gate is formed on the substrate.

10 Claims, 7 Drawing Sheets

METHOD FOR MANUFACTURING NANOWIRE TRANSISTOR DEVICE

CROSS REFERENCE TO RELATED APPLICATIONS

This application is a division of U.S. application Ser. No. 14/634,904 filed on Mar. 2, 2015, now U.S. Pat. No. 9,559,164 issued Jan. 31, 2017, the contents of which are hereby incorporated by reference in its entirety.

BACKGROUND OF THE INVENTION

1. Field of the Invention

The invention relates to a nanowire transistor device and a method for manufacturing the nanowire transistor device, and more particularly, to a multiple-core nanowire transistor device and a method for manufacturing the multi-core nanowire transistor device.

2. Description of the Prior Art

Conventional planar metal-oxide-semiconductor (hereinafter abbreviated as MOS) transistor has difficulty when scaling down to 65 nm and below. Therefore the non-planar transistor technology such as Fin Field effect transistor (hereinafter abbreviated as FinFET) technology that allows smaller size and higher performance is developed to replace the planar MOS transistor. For example, dual-gate FinFET device, tri-gate FinFET device, and omega-FinFET device have been provided. Furthermore, gate-all-around (GAA) nanowire FET device is progressed for achieving the ongoing goals of High performance, low cost, increased miniaturization of integrated circuit components, and greater packaging density of integrated circuits.

SUMMARY OF THE INVENTION

According to the claimed invention, a nanowire transistor device is provided. The nanowire transistor device includes a substrate, a plurality of nanowires formed on the substrate, and a gate surrounding at least a portion of each nanowire. The nanowires respectively include a first semiconductor core and a second semiconductor core surrounding the first semiconductor core. A lattice constant of the second semiconductor core is different from a lattice constant of the first semiconductor core.

According to the claimed invention, a method for manufacturing a nanowire transistor device is provided. The method includes the following steps: A substrate is provided, and the substrate includes a plurality of nanowires suspended thereon. Each of the nanowires includes a first semiconductor core. Next, a first selective epitaxial growth (hereinafter abbreviated as SEG) process is performed to form second semiconductor cores respectively surrounding the first semiconductor cores. The second semiconductor cores are spaced apart from the substrate. After forming the second semiconductor core, a gate is formed on the substrate.

According to the nanowire transistor device and the method for manufacturing the nanowire transistor device provided by the present invention, at least one SEG process is performed to form an epitaxial semiconductor layer surrounding the nanowires. The epitaxial semiconductor layer, of which the lattice constant is different from the nanowires, is provided to improve a carrier mobility of the nanowire channel of the nanowire transistor device. Accordingly, the nanowires of the multi-core nanowire transistor device respectively include at least the first semiconductor core and the second semiconductor core surrounding and covering the first semiconductor core. More important, the nanowire channel is formed in the second semiconductor core and thus the carrier mobility is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-2C are schematic drawings illustrating a method for manufacturing a nanowire transistor device provided by a first preferred embodiment of the present invention, wherein FIG. 2C is an enlarged cross-sectional view taken along a Line B-B' of FIG. 2A.

FIGS. 3A-3C are schematic drawings illustrating a method for manufacturing a nanowire transistor device provided by a second preferred embodiment of the present invention, wherein FIG. 3B is a cross-sectional view taken along a Line A-A' of FIG. 3A, and FIG. 3C is an enlarged cross-sectional view taken along a Line B-B' of FIG. 3A.

FIGS. 4-5 are schematic drawings illustrating a method for manufacturing a nanowire transistor device provided by a third preferred embodiment of the present invention, wherein FIG. 5 is a schematic drawing in a step subsequent to FIG. 4.

FIG. 7-8 are schematic drawings illustrating a method for manufacturing a nanowire transistor device provided by a fourth preferred embodiment of the present invention, wherein FIG. 8 is a schematic drawing in a step subsequent to FIG. 7.

DETAILED DESCRIPTION

Figure 1A:
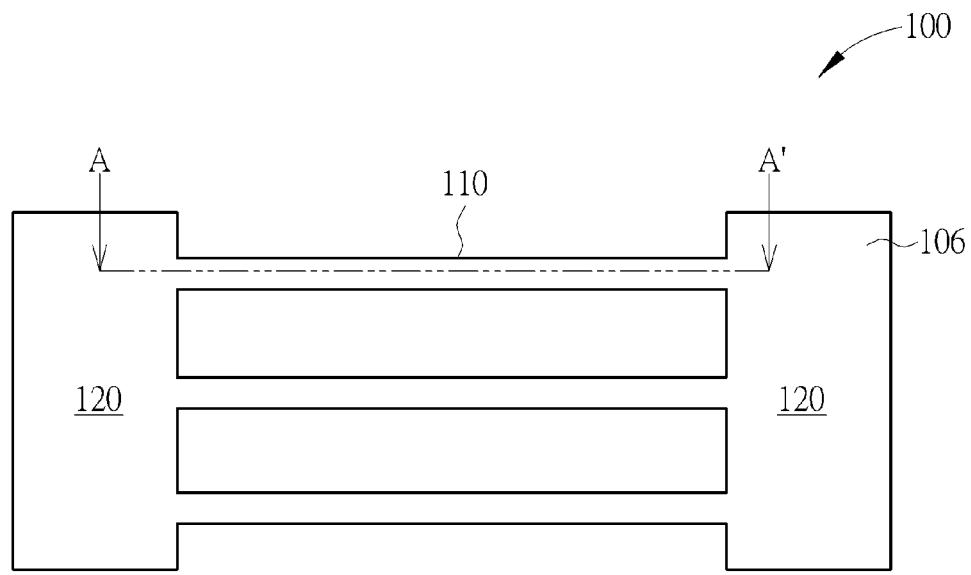

Please refer to FIGS. 1A-2C, which are schematic drawings illustrating a method of manufacturing a nanowire transistor device provided by a first preferred embodiment for the present invention. Please refer to FIG. 1A and FIG. 1B first. Please note that FIG. 1B is a cross-sectional view taken along a Line A-A' of FIG. 1A. The preferred embodiment provides a substrate 102, and the substrate 102 upwardly and sequentially includes an insulating layer 104 and a semiconductor layer 106 such as a single-crystalline silicon layer 106. Accordingly, the substrate 102, the insulating layer 104, and the single-crystalline silicon layer 106 construct a silicon-on-insulator (hereinafter abbreviated as SOI) substrate 100. Next, by patterning the single-crystalline silicon layer 106 and etching the insulating layer 104, a plurality of nanowires 110 are formed on the substrate 102 and two pads 120 are formed at two opposite ends of the nanowires 110. As shown in FIG. 1B, a recess 104r is formed in the insulating layer 104 correspondingly under the nanowires 110. Therefore, the nanowires 110 are suspended over the SOI substrate 100, particularly speaking, the nanowires 110 are suspended over the insulating layer 104. Consequently, the nanowires 110 are spaced apart from the substrate 102. Furthermore, since the pads 120 are formed on the insulating layer 104, the pads 120 are spaced apart from the substrate 102 by the insulating layer 104 according to the present preferred embodiment. As shown in FIG. 1A, the pads 120 are formed at the two opposite ends of the nanowires 110 and thus a ladder pattern formed by the nanowires 110 and the pads 120 is obtained. The nanowires 110 are taken as the rungs of the ladder pattern while the pads 120 are taken as the rails of the ladder pattern.

Figure 1B:
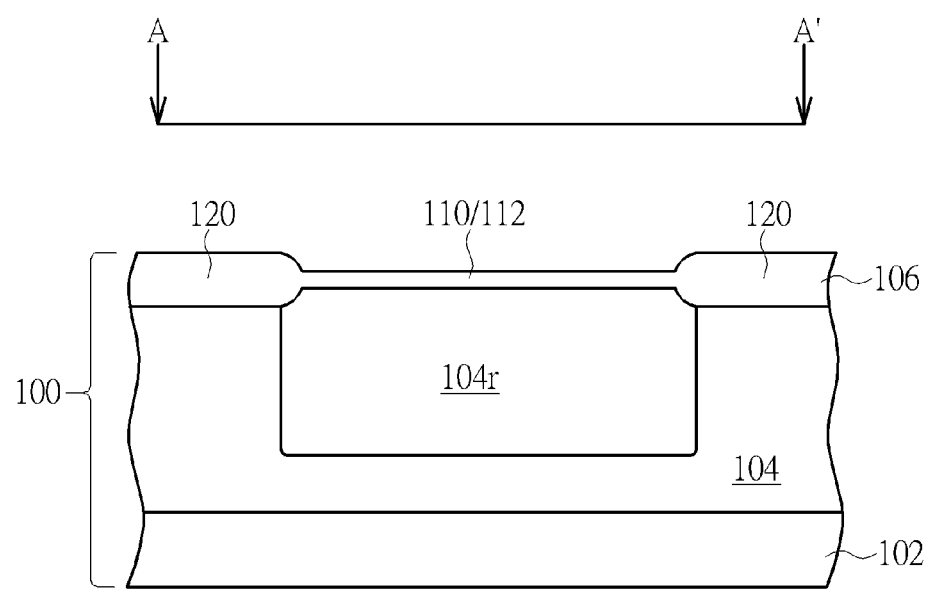
FIG. 1B is a cross-sectional view taken along a Line A-A' of FIG. 1A.

Please still refer to FIGS. 1A and 1B. The nanowires 110 respectively include a first semiconductor core 112. According to the present preferred embodiment, the first semiconductor cores 112 and the pads 120 include a same material such as the single-crystalline silicon, but not limited to this. Those skilled in the art would easily realize that the first semiconductor cores 112 can include other semiconductor material such as germanium (Ge) in a modification to the present preferred embodiment. Additionally, the first semiconductor cores 112 and the pads 120 can include different materials according to another modification. Furthermore, a trimming step can be optionally performed to further reduce a diameter of the first semiconductor core 112 of the nanowires 110 if required.

Figure 2A:
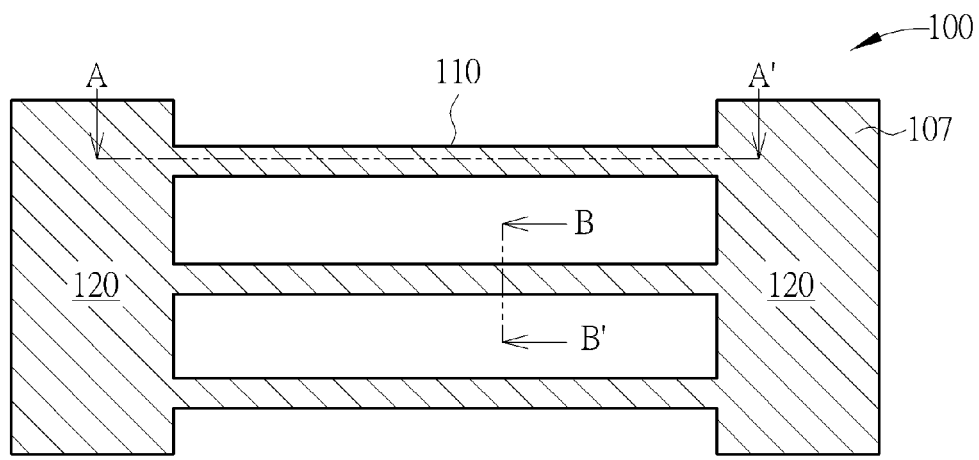
FIG. 2A is a schematic drawing in a step subsequent to FIG. 1A.
Figure 2B:
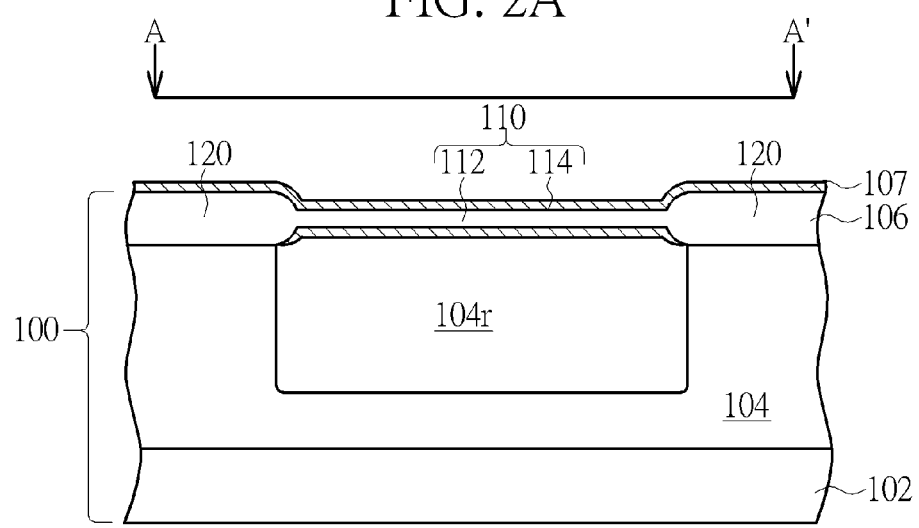
FIG. 2B is a schematic drawing in a step subsequent to FIG. 1B and a cross-sectional view taken along a Line A-A' of FIG. 2A.
Figure 2C:
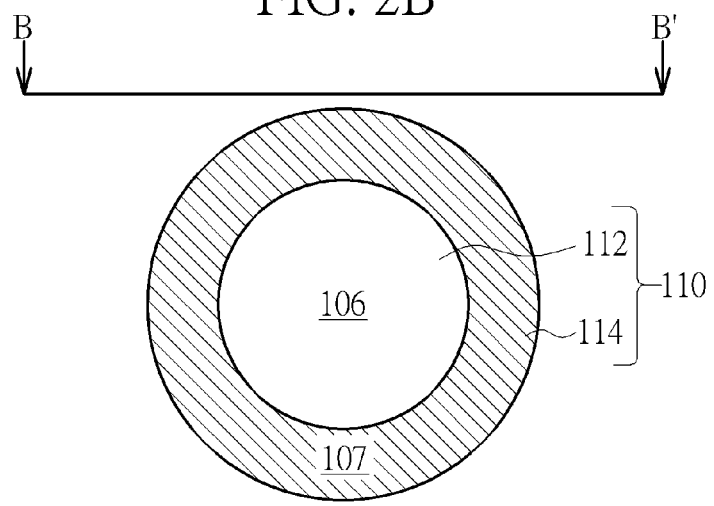

Please refer to FIGS. 2A-2C. It should be noted that FIG. 2B is a cross-sectional view taken along a Line A-A' of FIG. 2A and FIG. 2C is an enlarged cross-sectional view taken along a Line B-B' of FIG. 2A. Next, a first SEG process is performed to form a semiconductor layer, particularly an epitaxial semiconductor layer 107 on the substrate 102. The epitaxial semiconductor layer 107 includes a material having a lattice constant different from the first semiconductor cores 112. For example, the epitaxial semiconductor layer 107 provided by the preferred embodiment can include silicon germanium ($Si_{1-x}Ge_x$) or silicon carbide (SiC) depending on different conductivity type requirements. Furthermore, the epitaxial semiconductor layer 107 can include a Ge concentration gradient increasing upwardly. For example, the Ge concentration of the epitaxial semiconductor layer 107 can be upwardly increased to 60%, but not limited to this. However, those skilled in the art should easily realize that the epitaxial semiconductor layer 107 can include material other than SiGe or SiC, such as gallium arsenide (GaAs), indium arsenide (InAs), indium phosphide (InP), or other III-V compound semiconductor materials. It noteworthy that because the epitaxial material grows along with the semiconductor (such as silicon in the preferred embodiment) lattice, the epitaxial semiconductor layer 107 is only formed on the exposed surface of the semiconductor layer 106. As shown in FIGS. 2B and 2C, since the first semiconductor cores 112 are entirely suspended over the substrate 102, surfaces of the first semiconductor cores 112 are entirely exposed and thus the epitaxial semiconductor layer 107 is to surround and cover the entire the first semiconductor cores 112. Consequently, second semiconductor cores 114 respectively surrounding the first semiconductor cores 112 are obtained as shown in FIGS. 2A-2C. A lattice of the second semiconductor cores 114 is different from a lattice of the first semiconductor cores 112. Furthermore, the second semiconductor cores 114 are still suspended over and spaced apart from the substrate 102. Additionally, the epitaxial semiconductor layer 107 is formed to cover the pads 120, as shown in FIG. 2B.

Next, a gate 130 (shown in FIG. 5) is formed on the substrate 102. The gate 130 is formed to surround and cover a portion of each nanowire 110. Preferably, the gate 130 surrounds and covers a central portion of each nanowire 110 (shown in FIG. 5). The gate 130 can include a gate conductive layer (not shown) and a gate dielectric layer (not shown). It is noteworthy that nanowire channel is formed in the nanowire 110 at where it is covered by the gate 130. Furthermore, ion implantation can be performed to form source/drain (not shown) in the exposed nanowires 110 after forming the gate 130. Accordingly, a nanowire transistor device is obtained. It is noteworthy that since the nanowires 110 are suspended over the substrate 102, the gate 130 covers the entire central portion of each nanowire 110. Therefore, the channel region is formed in the circular periphery of each nanowire 110, and thus a gate-all-around (GAA) nanowire transistor device is obtained.

According to the nanowire transistor device and the manufacturing method thereof provided by the preferred embodiment, one SEG process is performed to form the epitaxial semiconductor layer 107, of which the lattice constant is different from the first semiconductor cores 112, no matter what kind of material the first semiconductor cores 112 include. And the epitaxial semiconductor layer 107 forms the second semiconductor cores 114. That is, the lattice constant of the second semiconductor cores 114 (such as SiGe or SiC) is different from the lattice constant of the first semiconductor cores 112 (such as Si) in the preferred embodiment. Consequently, a dual-core nanowire transistor device is obtained. More important, the channel regions are formed in the second semiconductor cores 114 and thus the carrier mobility is improved. And accordingly, electrical performance of the nanowire transistor device is improved.

Figure 3A:
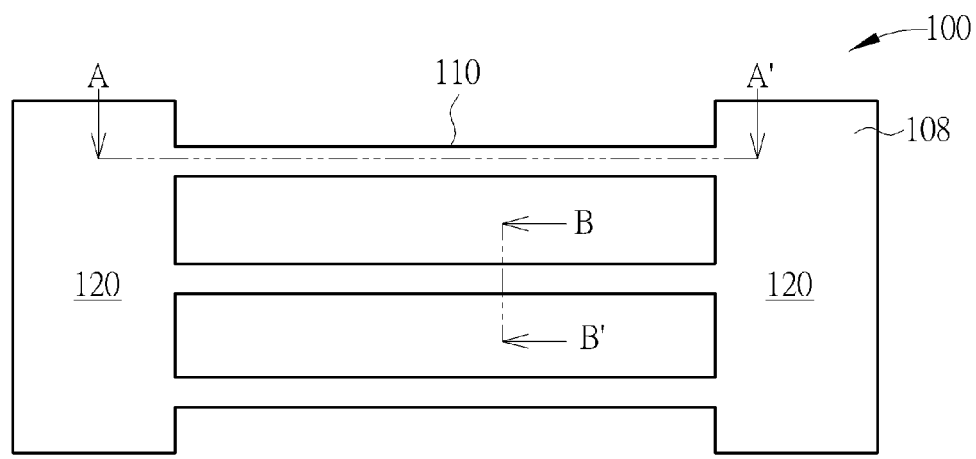
Figure 3B:
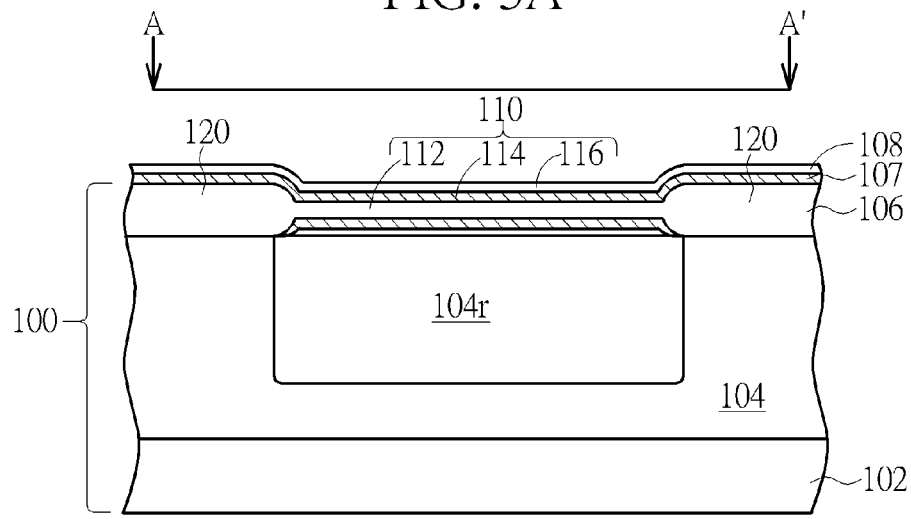
Figure 3C:
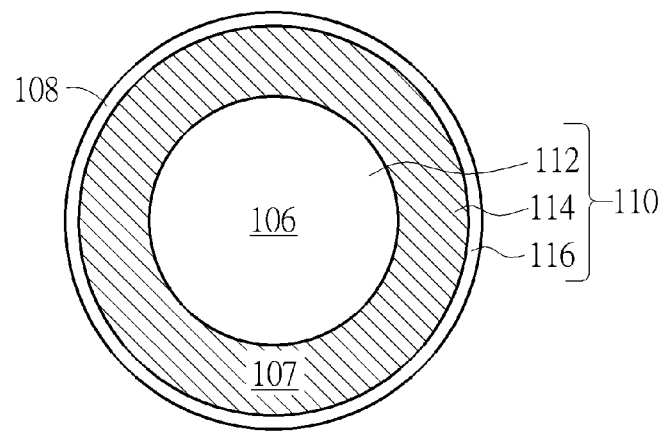

Please refer to FIGS. 3A-3C, which are schematic drawings illustrating a method for manufacturing a nanowire transistor device provided by a second preferred embodiment of the present invention. Please refer to FIG. 3A and FIG. 3B first. It should be noted that elements the same in the first and second preferred embodiments are designated by the same numerals. The elements the same in the first and second preferred embodiments can include the same material, and thus those details are omitted in the interest of brevity. Furthermore, please note that FIG. 3B is a cross-sectional view taken along a Line A-A' of FIG. 3A and FIG. 3C is a cross-sectional view taken along a Line B-B' of FIG. 3A. The preferred embodiment provides a substrate 102, and the substrate 102 upwardly and sequentially includes an insulating layer 104 and a semiconductor layer 106 such as a single-crystalline silicon layer 106. As mentioned above, the substrate 102, the insulating layer 104, and the single-crystalline silicon layer 106 construct a SOI substrate 100. A plurality of nanowires 110 are formed on the substrate 102 and two pads 120 are formed at two opposite ends of the nanowires 110. As shown in FIG. 3B, a recess 104r is formed in the insulating layer 104 correspondingly under the nanowires 110. Therefore, the nanowires 110 are suspended over the SOI substrate 100, particularly speaking, the nanowires 110 are suspended over the insulating layer 104. Consequently, the nanowires 110 are spaced apart from the substrate 102. Furthermore, since the pads 120 are formed on the insulating layer 104, the pads 120 are spaced apart from the substrate 102 by the insulating layer 104 according to the preferred embodiment. As shown in FIG. 3A, the pads 120 are formed at the two opposite ends of the nanowires 110 and thus a ladder pattern formed by the nanowires 110 and the pads 120 is obtained. The nanowires 110 are taken as the rungs of the ladder pattern while the pads 120 are taken as the rails of the ladder pattern.

Please refer to FIGS. 3A and 3B. The nanowires 110 respectively include a first semiconductor core 112. The first semiconductor cores 112 and the pads 120 include a material the same with those mentioned in the above preferred embodiment and therefore those details are omitted for simplicity. Furthermore, a trimming step can be optionally performed to further reduce a diameter of the first semiconductor core 112 of the nanowires 110 if required.

Please refer to FIGS. 3A-3C. Next, a first SEG process is performed to form a semiconductor layer, particularly an epitaxial semiconductor layer 107 on the substrate 102. The epitaxial semiconductor layer 107 includes a material having a lattice constant different from the first semiconductor cores 112. The epitaxial semiconductor layer 107 includes the material the same with those mentioned in the above preferred embodiment and therefore those details are omitted for simplicity. As mentioned above, because the epitaxial material grows along with the semiconductor (such as Si in the preferred embodiment) lattice, the epitaxial semiconductor layer 107 is only formed on the exposed surface of the semiconductor layer 106. As shown in FIGS. 3B and 3C, since the first semiconductor cores 112 are entirely suspended over the substrate 102, surfaces of the first semiconductor cores 112 are entirely exposed and thus the epitaxial semiconductor layer 107 is to surround and cover the entire the first semiconductor cores 112. Consequently, second semiconductor cores 114 respectively surrounding the first semiconductor cores 112 are obtained. As shown in FIGS. 3B and 3C, the second semiconductor cores 114 are still suspended over and spaced apart from the substrate 102. And a lattice of the second semiconductor cores 114 is different from a lattice of the first semiconductor cores 112.

Please still refer to FIGS. 3A-3C. After the first SEG process, a second SEG process is performed to form another epitaxial semiconductor layer 108 on the epitaxial semiconductor layer 107. A lattice constant of 114 the epitaxial semiconductor layer 108 is different from the lattice constant of the epitaxial semiconductor layer 107. According to the preferred embodiment, the epitaxial semiconductor layer 108 preferably includes Si, but not limited to this. As mentioned above, because the epitaxial material grows along with the semiconductor (such as SiGe or SiC in the preferred embodiment) lattice, the epitaxial semiconductor layer 108 is only formed on the exposed surface of the epitaxial semiconductor layer 107. As shown in FIGS. 3B and 3C, since the second semiconductor cores 114 are entirely suspended over the substrate 102, surfaces of the second semiconductor cores 114 are entirely exposed and thus the second epitaxial semiconductor layer 108 is to surround and cover the entire the second semiconductor cores 114. Consequently, third semiconductor cores 116 respectively surrounding the second semiconductor cores 114 are obtained as shown in FIGS. 3A-3C. Furthermore, the third semiconductor cores 116 are still suspended over and spaced apart from the substrate 102.

Next, a gate 130 (shown in FIG. 5) is formed on the substrate 102. The gate 130 is formed to surround and cover a portion of each nanowire 110. Preferably, the gate 130 surrounds and covers a central portion of each nanowire 110 (shown in FIG. 5). The gate 130 can include a gate conductive layer (not shown) and a gate dielectric layer (not shown). It is noteworthy that nanowire channel is formed in the nanowire 110 at where it is covered by the gate 130. Furthermore, ion implantation can be performed to form source/drain (not shown) in the exposed nanowires 110 after forming the gate 130. Accordingly, a nanowire transistor device is obtained.

According to the nanowire transistor device and the manufacturing method thereof provided by the preferred embodiment, two SEG processes are performed to form the epitaxial semiconductor layers 107 and 108, no matter what kind of material the first semiconductor cores 112 include. And thus the lattice constant of the second semiconductor cores 114 (such as SiGe or SiC) is different from the lattice constant of the first semiconductor cores 112 (such as Si) while the third semiconductor cores 116 (such as Si) is different from the lattice constant of the second semiconductor cores 114 (such as SiGe or SiC) in the preferred embodiment. Consequently, a tri-core nanowire transistor device is obtained. In the tri-core nanowire transistor device, the channel regions are formed in the second semiconductor cores 114 and thus the carrier mobility is improved while the third semiconductor cores 116 sandwiched between the second semiconductor cores 114 and the gate 130 provide an improved interface between the nanowires 110 and the gate dielectric layer. Furthermore, the epitaxial semiconductor layer 108 (including Si) formed on the pads 120 serves as a better object for forming silicide. Consequently, agglomeration issue is eliminated due to the third semiconductor cores 116. And accordingly, electrical performance of the nanowire transistor device is improved.

Figure 4:
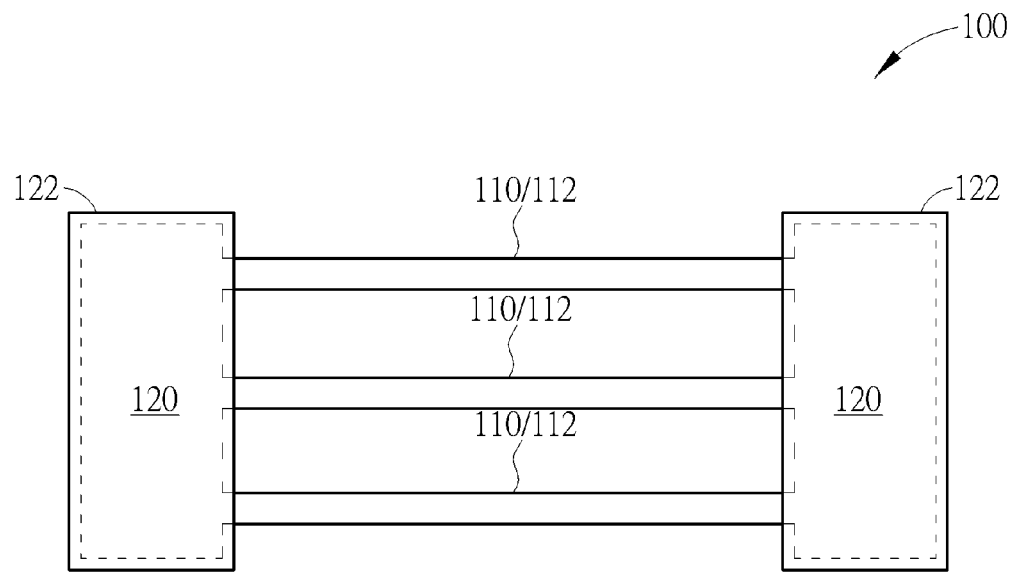
Figure 5:
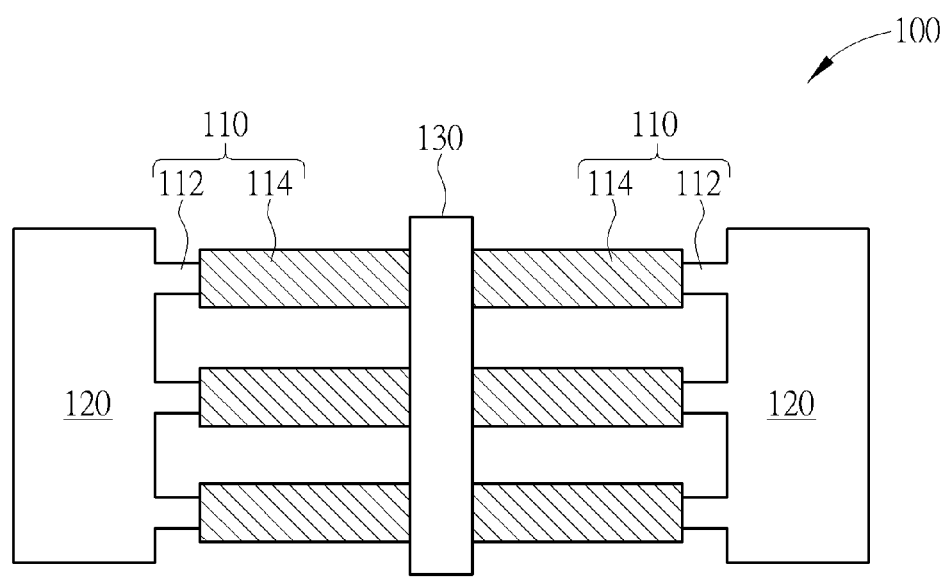

Please refer to FIGS. 4-5, which are schematic drawings illustrating a method for manufacturing a nanowire transistor device provided by a third preferred embodiment of the present invention. It should be noted that elements the same in the first, second and third preferred embodiments are designated by the same numerals. The elements the same in the first, second and third preferred embodiments can include the same materials, and thus those details are omitted in the interest of brevity. The preferred embodiment provides a SOI substrate 100, and the SOI substrate 100 upwardly and sequentially includes a substrate, an insulating layer and a semiconductor layer such as a single-crystalline silicon layer. Next, by patterning the single-crystalline silicon layer and etching the insulating layer, a plurality of nanowires 110 are formed on the substrate and two pads 120 are formed at two opposite ends of the nanowires 110. As mentioned above, a recess is formed in the insulating layer correspondingly under the nanowires 110. Therefore, the nanowires 110 are suspended over the SOI substrate 100, particularly speaking, the nanowires 110 are suspended over the insulating layer. Consequently, the nanowires 110 are spaced apart from the substrate. Furthermore, since the pads 120 are formed on the insulating layer, the pads 120 are spaced apart from the substrate by the insulating layer according to the preferred embodiment. As shown in FIG. 4, the pads 120 are formed at the two opposite ends of the nanowires 110 and thus a ladder pattern formed by the nanowires 110 and the pads 120 is obtained. The nanowires 110 are taken as the rungs of the ladder pattern while the pads 120 are taken as the rails of the ladder pattern.

Please refer to FIG. 4 again. The nanowires 110 respectively include a first semiconductor core 112. The first semiconductor cores 112 and the pads 120 include a material the same with those mentioned in the above preferred embodiments, and therefore those details are omitted for simplicity. Furthermore, a trimming step can be optionally performed to further reduce a diameter of the first semiconductor core 112 of the nanowires 110 if required.

Please still refer to FIG. 4. Next, a patterned hard mask 122 entirely covering the pads 120 is formed on the SOI substrate 100. Additionally, the patterned hard mask 122 can be formed to cover a portion of each first semiconductor core 112. Subsequently, a first SEG process is performed to form an epitaxial semiconductor layer on the semiconductor layer. The epitaxial semiconductor layer includes a material having a lattice constant different from the first semiconductor cores 112. The epitaxial semiconductor layer includes the material the same with those mentioned in the above preferred embodiment, and therefore those details are omitted for simplicity. As mentioned above, because the epitaxial material grows along with the semiconductor (such as Si in the preferred embodiment) lattice, the epitaxial semiconductor layer is only formed on the exposed surface of the nanowires 110. Since the first semiconductor cores 112 are entirely suspended over the SOI substrate 100, the epitaxial semiconductor layer is to surround and cover the entire the first semiconductor cores 112. Consequently, second semiconductor cores 114 respectively surrounding the first semiconductor cores 112 are obtained. The second semiconductor cores 114 are still suspended over and spaced apart from the SOI substrate 100. And a lattice of the second semiconductor cores 114 is different from a lattice of the first semiconductor cores 112.

Subsequent to the first SEG process, a gate 130 is formed on the SOI substrate 100. The gate 130 is formed to surround and cover a portion of each nanowire 110. Preferably, the gate 130 surrounds and covers a central portion of each nanowire 110. The gate 130 can include a gate conductive layer (not shown) and a gate dielectric layer (not shown). According to the preferred embodiment, the gate dielectric layer can include any suitable dielectric material such as, for example but not limited to, silicon oxide (SiO), silicon nitride (SiN), silicon oxynitride (SiON), hafnium oxide (HfO), or any suitable high-k dielectric material. The gate conductive layer can include, for example but not limited to, polysilicon or work function metal layers required in the metal gate approach. It is noteworthy that the nanowire channel is formed in the nanowire 110 at where it is covered by the gate 130. After forming the gate 130, the patterned hard mask 122 is removed and followed by performing an ion implantation to form source/drain (not shown) in the exposed nanowires 110. Accordingly, a nanowire transistor device is obtained. Thereafter, steps such as forming an interlayer dielectric (ILD) layer to fill up the recess and to cover the gate 130 and the source/drain, and constructing interconnections to provide electrical connection to the gate 130 and the source/drain can be performed and those details are omitted in the interest of brevity.

It should be noted that the patterned hard mask 122 can include any suitable dielectric material such as, for example but not limited to, SiN, silicon carbon nitride (SiCN), or SiON. Additionally, the patterned hard mask 122 can be removed before forming the gate or after forming gate. It should be easily realized that the patterned hard mask 122 can be left on the pads 120 if silicides are not required.

According to the nanowire transistor device and the method for manufacturing the nanowire transistor device provided by the preferred embodiment, one SEG process is performed to form the second semiconductor cores 114 on the first semiconductor cores 112, no matter what kind of material the first semiconductor cores 112 include. And the lattice constant of the second semiconductor cores 114 is different from the lattice constant of the first semiconductor cores 112. Consequently, a dual-core nanowire transistor device is obtained according to the preferred embodiment. In the dual-gate nanowire transistor device, the channel regions are formed in the second semiconductor cores 114 and thus the carrier mobility is improved. Furthermore, since the channel regions are formed at where the nanowires 110 are covered by the gate 130, that is, the channel regions are formed at the central region of each nanowire 110, the second semiconductor core 114 can be formed to surround only the central region of each first semiconductor core 112 while the pads 120 are blocked by the patterned hard mask 122 in the SEG process. Consequently, no epitaxial semiconductor layer is formed on the pads 120, and thus agglomeration issue is eliminated.

Figure 6:
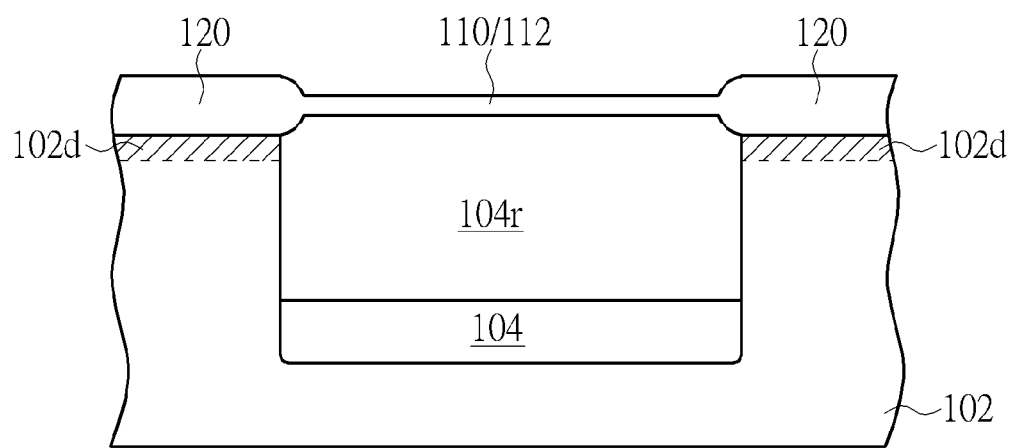
FIG. 6 is a schematic drawing illustrating a method for manufacturing a nanowire transistor device provided by a modification to the present invention.

Please refer to FIG. 6, which is a schematic drawing illustrating a method for manufacturing a nanowire transistor device provided by a modification to the present invention. It should be noted that elements the same in the aforementioned embodiments and the present modification are designated by the same numerals. The elements the same in aforementioned embodiments and the present modification can include the same materials, and thus those details are omitted in the interest of brevity. According to the modification, a Si-substrate 102 is provided. The Si-substrate 102 can include an insulating layer 104 formed thereon. A plurality of nanowires 110 are formed on the Si-substrate 102 and two pads 120 are formed at two opposite ends of the nanowires 110. As shown in FIG. 6, a recess 104r is formed in the insulating layer 104 correspondingly under the nanowires 110. Therefore, the nanowires 110 are suspended over the Si-substrate 102, particularly speaking, the nanowires 110 are suspended over the insulating layer 104. In the modification, the pads 120 and the Si-substrate 102 include a same material. However, as shown in FIG. 6, a conductivity type of the pads 120 is complementary to a conductivity type of the Si-substrate 102. For example, in a case that the nanowire transistor device is a p-typed MOS (hereinafter abbreviated as pMOS) transistor device, the pads 120 include p-dopants while the Si-substrate 102 includes n-dopants in a region 102 correspondingly under the pads 120. In a case that the nanowire transistor device is an n-typed MOS (hereinafter abbreviated as nMOS) transistor device, the pads 120 include n-dopants while the Si-substrate 102 includes p-dopants in a region 102d correspondingly under the pads 120. By including the dopants of complementary conductivity types, the pads 120 are electrically isolated from the Si-substrate 102. Additionally, the pads 120 are formed at the two opposite ends of the nanowires 110 and thus a ladder pattern formed by the nanowires 110 and the pads 120 is obtained. The nanowires 110 are taken as the rungs of the ladder pattern while the pads 120 are taken as the rails of the ladder pattern.

Please still refer to FIG. 6. The nanowires 110 respectively include a first semiconductor core 112. According to the modification, the first semiconductor cores 112 and the pads 120 include a material the same with those mentioned in the above preferred embodiments, and therefore those details are omitted for simplicity. Furthermore, a trimming step can be optionally performed to further reduce a diameter of the first semiconductor core 112 of the nanowires 110 if required. Next, a first SEG process is performed to form a second semiconductor core 114 (as shown in FIG. 2B) on a surface of the first semiconductor core 112, respectively. Furthermore, a second SEG process can be performed to form a third semiconductor core 116 (as shown in FIG. 3B) on a surface of the second semiconductor core 114 if required. The second semiconductor cores 114 and the third semiconductor cores 116 can include materials the same with those mentioned in the above preferred embodiments, and therefore those details are omitted for simplicity. It should be easily realized that the second semiconductor core 114/the third semiconductor core 116 can be formed only in the central region of each nanowire 110 while the pads 120 are protected in the SEG process(s) as above mentioned.

In the same concept, after forming the multi-core nanowires, a gate (not shown) is formed on the Si-substrate 102. The gate is formed to surround and cover a portion of each nanowire 110. Preferably, the gate surrounds and covers a central portion of each nanowire 110. The gate can include agate conductive layer (not shown) and a gate dielectric layer (not shown). It is noteworthy that nanowire channel is formed in the nanowires 110 at where it is covered by the gate. Furthermore, ion implantation can be performed to form source/drain (not shown) in the exposed nanowires 110 after forming the gate. Accordingly, a nanowire transistor device is obtained.

According to the nanowire transistor device and the manufacturing method thereof provided by the modification, it is conceivable that the nanowire transistor device can be formed not only on the SOI substrate, but also on the conventional Si-substrate. In other words, the nanowire transistor device and the manufacturing method thereof provided by the present invention include superior process flexibility.

Figure 7:
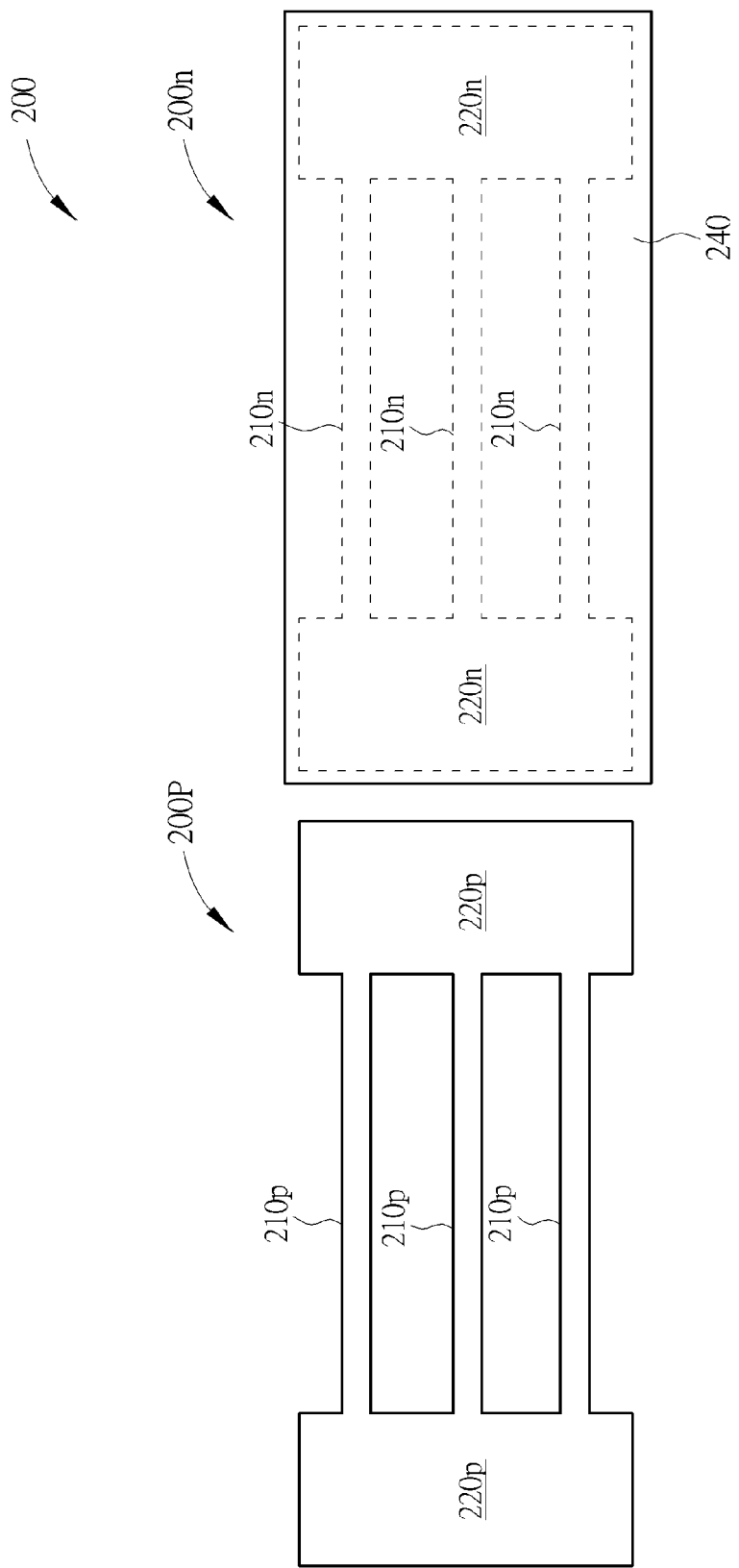
Figure 8:
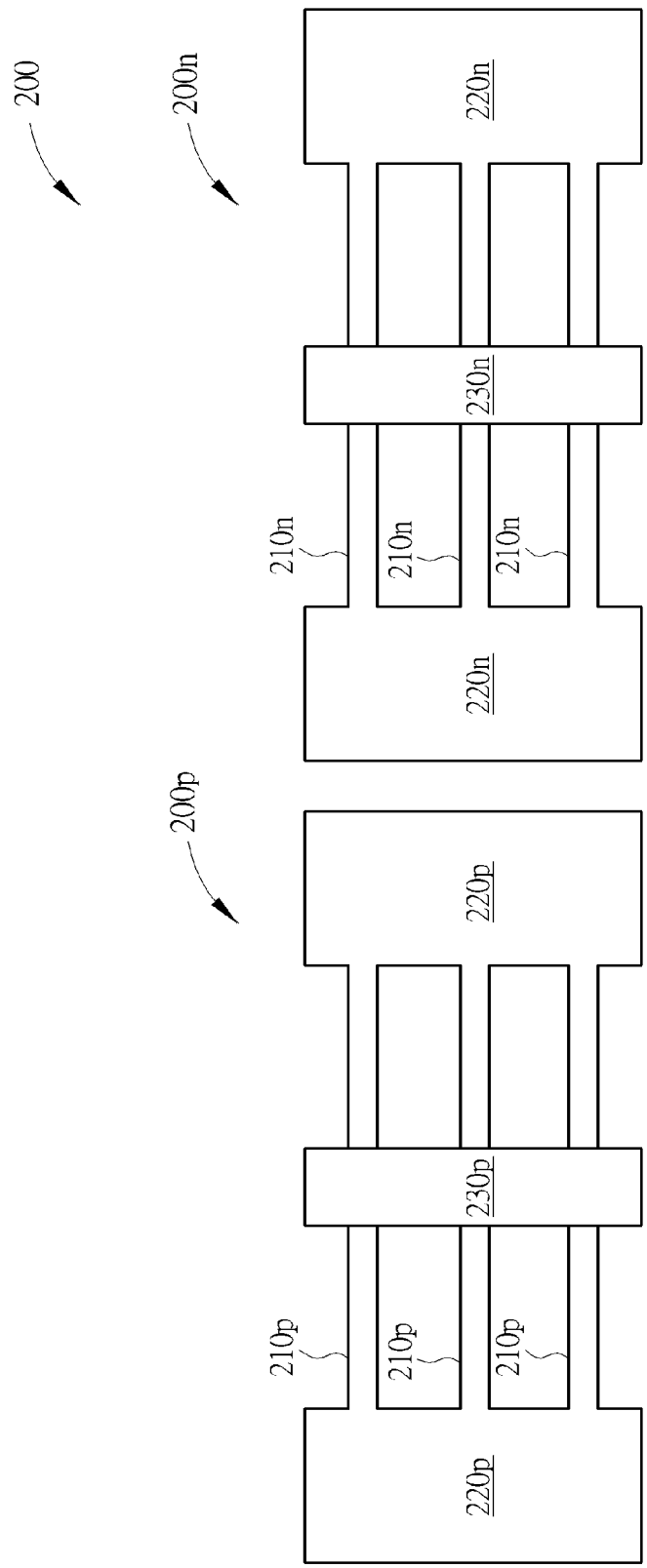

Please refer to FIG. 7-8, which are schematic drawings illustrating a nanowire transistor device and a manufacturing method for manufacturing a nanowire transistor device provided by a fourth preferred embodiment of the present invention. It should be noted that the method for manufacturing a nanowire transistor device provided by the present preferred embodiment is able to provide complementary metal-oxide-semiconductor (hereinafter abbreviated as CMOS) device. As shown in FIG. 7, the CMOS device can be formed on a substrate 200 such as, for example but not limited to, a SOI substrate 200. An nMOS region 200n and a pMOS region 200p are defined on the SOI substrate 200. A plurality of nanowires 210n are formed in the nMOS region 200n while a plurality of nanowires 210p are formed in the pMOS region 200p. The nanowires 210n are connected to each other by two pads 220n respectively disposed at two opposite ends of the nanowires 210n, and the nanowires 210p are connected to each other by two pads 220p respectively disposed at two opposite ends of the nanowires 210p. As mentioned above, the nanowires 210n and the nanowires 210p respectively include a first semiconductor core, and the first semiconductor cores and the pads 220n/220p can include a same material. Since those material choice for the first semiconductor cores is the same with those described in the aforementioned preferred embodiments, those details are omitted in the interest of brevity. Next, a patterned hard mask 240 covering and protecting the nMOS region 200n is formed on the SOI substrate 200.

Next, a first SEG process is performed to the pMOS region 200p. Consequently, second semiconductor cores respectively covering and surrounding the first semiconductor cores of the nanowires 210p are formed, and an epitaxial semiconductor layer is formed on each pad 220p. Since the first SEG process is performed to the pMOS region, the second semiconductor cores and the epitaxial semiconductor layers preferably include SiGe, but not limited to this. Subsequently, a second SEG process can be performed to the pMOS region 200p if required. Consequently, third semiconductor cores respectively covering and surrounding the second semiconductor cores are formed and another epitaxial semiconductor layer is formed on each pad 220p. The third semiconductor cores and the epitaxial semiconductor layers preferably include Si, but not limited to this. A cross-sectional view showing the first semiconductor cores, the second semiconductor cores, and the third semiconductor cores is the same as shown in FIG. 2C and FIG. 3C, therefore those details are omitted for simplicity. Then, the patterned hard mask 240 is removed and followed by performing steps such as gate formation (as shown in FIG. 5), source/drain formation, and silicide formation.

It should be understood that after removing the patterned hard mask 240, another patterned hard mask (not shown) can be formed to cover and protect the pMOS region 200p. And another first SEG process can be performed to the nMOS region 200n. Consequently, second semiconductor cores respectively covering and surrounding the first semiconductor cores are formed and an epitaxial semiconductor layer is formed on each pad 220n. Since the first SEG process is performed to the nMOS region 200n, the second semiconductor cores and the epitaxial semiconductor layers preferably include SiC, but not limited to this. Subsequently, another second SEG process can be performed to the nMOS region 200n if required. Consequently, third semiconductor cores respectively covering and surrounding the second semiconductor cores are formed and another epitaxial semiconductor layer is formed on each pad 220n. The third semiconductor cores and the epitaxial semiconductor layers preferably include Si, but not limited to this. A cross-sectional view showing the first semiconductor cores, the second semiconductor cores, and the third semiconductor cores is the same as shown in FIG. 2C and FIG. 3C, therefore those details are omitted for simplicity.

Please refer to FIG. 8. After performing the abovementioned SEG process (s), a gate 230p covering a portion of each nanowire 210p is formed in the pMOS region 200p, and a gate 230n covering a portion of each nanowire 210n is formed in the nMOS region 200n. As mentioned above, the gates 230p and 230n respectively includes a gate dielectric layer such as, for example but not limited to, SiO, SiN, SiON, HfO, or any suitable high-k dielectric material. The gates 230p and 230n respectively include a gate conductive layer such as, for example but not limited to, polysilicon or work function metals for the metal gate approach. After forming the gate 230p/230n, source/drain formation and silicide formation can be performed and those details are all omitted for simplicity.

According to the nanowire transistor devices and the manufacturing method thereof provided by the present preferred embodiment, the nMOS transistor and the pMOS transistor, which construct the CMOS device, respectively include multi-core nanowires. The channel region is formed in the second semiconductor cores of the multi-core nanowires, and thus carrier mobility of the channel region is improved. Furthermore, the third semiconductor cores serve as a better object for forming silicide. Consequently, agglomeration issue is eliminated. More important, it is concluded that the method for manufacturing the nanowire transistor device provided by the present invention is able to fabricate the CMOS device in state-in-the-art. That is, the present invention is able to manufacturing CMOS device constructed by the nanowire nMOS transistor and the nanowire pMOS transistor without increasing process complexity.

According to the nanowire transistor device and the manufacturing method thereof, the present invention, at least one SEG process is performed to form an epitaxial semiconductor layer surrounding the nanowires. The epitaxial semiconductor layer, of which the lattice constant is different from the nanowires, is provided to improve a carrier mobility of the nanowire channel of the nanowire transistor device. Accordingly, the nanowires of the multi-core nanowire transistor device respectively include at least the first semiconductor core and the second semiconductor core surrounding and covering the first semiconductor core. More important, the nanowire channel is formed in the second semiconductor core and thus the carrier mobility is improved. Furthermore, a second SEG process can be performed to form the third semiconductor cores for the multi-core nanowire transistor device, and the third semiconductor cores improve the interface between the nanowires and the gate dielectric layer. Additionally, the method for manufacturing the nanowire transistor device is able to form the nanowire transistor device on SOI substrate or the Si-substrate. Furthermore, the method for manufacturing the nanowire transistor device is able to form the CMOS device in state-of-the-art. Briefly speaking, the method for manufacturing the nanowire transistor device provided by the present invention is to fabricate nanowire transistor device(s) without increasing process complexity and to provide superior process flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a nanowire transistor device, comprising:
   providing a substrate comprising a plurality of nanowires suspending thereon, and each of the nanowires comprising a first semiconductor core;
   performing a first selective epitaxial growth (SEG) process to form second semiconductor cores respectively surrounding the first semiconductor cores, the second semiconductor cores being spaced apart from the substrate; and
   forming a gate on the substrate, the gate surrounding at least a portion of each nanowire, the gate being spaced apart from the first semiconductor core by the second semiconductor core.

2. The method for manufacturing the nanowire transistor device according to claim 1, wherein the gate surrounds central portion of each nanowire.

3. The method for manufacturing the nanowire transistor device according to claim 1, wherein a lattice constant of the second semiconductor cores is different from a lattice constant of the first semiconductor cores.

4. The method for manufacturing the nanowire transistor device according to claim 3, wherein the first semiconductor core comprises silicon and the second semiconductor core comprises SiGe or SiC.

5. The method for manufacturing the nanowire transistor device according to claim 1, further comprising performing a second SEG process to form third semiconductor cores respectively surrounding the second semiconductor cores.

6. The method for manufacturing the nanowire transistor device according to claim 5, wherein the third semiconductor core comprises silicon.

7. The method for manufacturing the nanowire transistor device according to claim 1, further comprising a pad at respectively at two opposite of the nanowires.

8. The method for manufacturing the nanowire transistor device according to claim 7, further comprising forming a patterned hard mask covering the pads before performing the first SEG process.

9. The method for manufacturing the nanowire transistor device according to claim 8, wherein the patterned hard mask covers a portion of first semiconductor cores.

10. The method for manufacturing the nanowire transistor device according to claim 8, further comprising removing the patterned hard mask after forming the gate.

* * * * *